(12) United States Patent
Yamazaki et al.

(10) Patent No.: US 9,087,700 B2
(45) Date of Patent: Jul. 21, 2015

(54) OXIDE SEMICONDUCTOR FILM, TRANSISTOR, AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masahiro Takahashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 68 days.

(21) Appl. No.: 13/790,479

(22) Filed: Mar. 8, 2013

(65) Prior Publication Data

US 2014/0097428 A1  Apr. 10, 2014

(30) Foreign Application Priority Data

Mar. 14, 2012 (JP) .................................. 2012-056643

(51) Int. Cl.
 *H01L 29/04* (2006.01)
 *H01L 29/786* (2006.01)
 *H01L 29/26* (2006.01)
(52) U.S. Cl.
 CPC .............. *H01L 29/045* (2013.01); *H01L 29/26* (2013.01); *H01L 29/7869* (2013.01)
(58) Field of Classification Search
 CPC ... H01L 29/045; H01L 29/7869; H01L 29/26; H01L 29/04; H01L 29/66969; H01L 29/41733
 USPC .......... 257/43, 49, 51, 57, E21.411, E29.273; 438/197, 85, 86, 104
 See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1737044 A  12/2006
EP  2226847 A  9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Thinh T Nguyen
(74) *Attorney, Agent, or Firm* — Eric J. Robinson; Robinson Intellectual Property Law Office, P.C.

(57) ABSTRACT

To provide an oxide semiconductor film which has high stability and does not easily cause variation in electric characteristics of a transistor, a transistor including the oxide semiconductor film in its channel formation region, and a highly reliable semiconductor device including the transistor. The oxide semiconductor film including indium includes a crystal part whose c-axis is substantially perpendicular to a surface of the oxide semiconductor film. In the crystal part, the length of a crystal arrangement part containing indium and oxygen on a plane perpendicular to the c-axis is more than 1.5 nm. Further, the semiconductor device includes the transistor including the oxide semiconductor film in its channel formation region.

8 Claims, 8 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,186,302 B2 * | 3/2007 | Chakraborty et al. .......... 148/33 |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,638,123 B2 * | 1/2014 | Ohnuki .......... 326/103 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0193625 A1 * | 8/2012 | Sasagawa et al. .............. 257/57 |
| 2012/0241735 A1 * | 9/2012 | Honda et al. .................... 257/43 |
| 2014/0247650 A1 * | 9/2014 | Kobayashi et al. .......... 365/149 |
| 2014/0340127 A1 * | 11/2014 | Kobayashi et al. .......... 327/109 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakijma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD 'Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), May 20, 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Eng.Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner

OXIDE SEMICONDUCTOR FILM, TRANSISTOR, AND SEMICONDUCTOR DEVICE

BACKGROUND OF THE INVENTION

1. Field of the Invention

The present invention relates to an oxide semiconductor film, a transistor, a semiconductor device, and manufacturing methods thereof.

In this specification, a semiconductor device refers to all types of devices which can function by utilizing semiconductor characteristics; an electro-optical device, a semiconductor circuit, and an electronic appliance are all semiconductor devices.

2. Description of the Related Art

Attention has been focused on a technique for forming a transistor using a semiconductor thin film formed over a substrate having an insulating surface (also referred to as thin film transistor (TFT)). The transistor is applied to a wide range of electronic devices such as an integrated circuit (IC) or an image display device (display device). A silicon-based semiconductor material is widely known as a material for a thin semiconductor film applicable to a transistor.

Further, recently, an oxide semiconductor has been attracting attention as a material of a thin semiconductor film. For example, a transistor whose semiconductor layer including an amorphous oxide containing indium (In), gallium (Ga), and zinc (Zn) (an In—Ga—Zn—O-based amorphous oxide) is formed over a substrate is disclosed (see Patent Document 1).

REFERENCE

Patent Document

[Patent Document 1] Japanese Published Patent Application No. 2011-181801

SUMMARY OF THE INVENTION

Improvement in reliability of semiconductor devices is important for commercialization of the semiconductor devices. Variation and decrease in electric characteristics of the semiconductor devices might particularly reduce the reliability thereof.

The stability to heat, light, or the like of a semiconductor film used for a channel formation region of a transistor significantly influences variation in electric characteristics of a semiconductor device.

An object is to provide an oxide semiconductor film which has high stability and does not easily cause variation in electric characteristics of a transistor.

Another object is to provide a transistor which includes the oxide semiconductor film in its channel formation region and has electrically stable characteristics.

Another object is to provide a highly reliable semiconductor device including the transistor.

In the invention disclosed in this specification, an oxide semiconductor film is an oxide semiconductor film including a crystal part whose c-axis is substantially perpendicular to a surface of the oxide semiconductor film, i.e., a c-axis aligned crystalline oxide semiconductor (CAAC-OS) film. In this specification, an oxide semiconductor film including a crystal part whose c-axis is substantially perpendicular to a surface of the oxide semiconductor film is referred to as CAAC-OS film.

One embodiment of the invention disclosed in this specification is an oxide semiconductor film including indium, which includes a crystal part whose c-axis is substantially perpendicular to a surface of the oxide semiconductor film and in which the length of a crystal arrangement part containing indium and oxygen on a plane perpendicular to the c-axis in the crystal part is more than 1.5 nm.

Another embodiment of the invention disclosed in this specification is an oxide semiconductor film including indium, which includes a crystal part whose c-axis is substantially perpendicular to a surface of the oxide semiconductor film and in which the length of a crystal arrangement part containing indium and oxygen on a plane perpendicular to the c-axis in the crystal part is more than or equal to 2 nm and less than or equal to 20 nm.

Another embodiment of the invention disclosed in this specification is an oxide semiconductor film including indium, which includes a plurality of crystal parts. C-axes of the plurality of crystal parts are aligned. Each of the c-axes is substantially perpendicular to a surface of the oxide semiconductor film. In each of the plurality of crystal parts, the length of a crystal arrangement part containing indium and oxygen on a plane perpendicular to the c-axes is more than 1.5 nm.

Another embodiment of the invention disclosed in this specification is an oxide semiconductor film including indium, which includes a plurality of crystal parts. C-axes of the plurality of crystal parts are aligned. Each of the c-axes is substantially perpendicular to a surface of the oxide semiconductor film. In each of the plurality of crystal parts, the length of a crystal arrangement part containing indium and oxygen on a plane perpendicular to the c-axes is more than or equal to 2 nm and less than or equal to 20 nm.

Another embodiment of the invention disclosed in this specification is an oxide semiconductor film including gallium and zinc in any of the structures of the above-described embodiments.

Another embodiment of the invention disclosed in this specification is a transistor including the above oxide semiconductor film in its channel formation region.

Another embodiment of the invention disclosed in this specification is a semiconductor device including a circuit which includes the above transistor.

In the oxide semiconductor film (CAAC-OS film) disclosed in this specification, detachment of a metal element in the film is unlikely to occur even when heat treatment is performed, and low photoresponse is exhibited, as compared to an amorphous oxide semiconductor film. Accordingly, the oxide semiconductor film (CAAC-OS film) disclosed in this specification is highly stable to heat and light.

Defects typified by oxygen defects in the oxide semiconductor film which is used for a channel formation region are preferably reduced. Defects typified by oxygen defects function as sources for supplying carriers in the oxide semiconductor film, which might change the electric conductivity of the oxide semiconductor film. The number of lone electrons in the oxide semiconductor film can be measured as a spin density of the oxide semiconductor film by electron spin resonance (ESR), and using the spin density, the number of oxygen defects can be estimated.

The oxide semiconductor film (CAAC-OS film) disclosed in this specification has a low spin density. The number of oxygen defects in the oxide semiconductor film is smaller than that in an amorphous oxide semiconductor film.

Accordingly, a transistor including the oxide semiconductor film (CAAC-OS film) disclosed in this specification in its channel formation region has stable electric conductivity and is more electrically stable to heat and light.

One embodiment of the present invention relates to an oxide semiconductor film, a transistor to which the oxide semiconductor film can be applied, and a semiconductor device including a circuit which includes the transistor. For example, one embodiment of the present invention relates to a semiconductor device including a transistor in which a channel formation region is formed using an oxide semiconductor or a semiconductor device including a circuit which includes such a transistor. For example, one embodiment of the present invention relates to an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

An oxide semiconductor film which has high stability and does not easily cause variation in electric characteristics of a transistor can be provided.

A transistor which includes the oxide semiconductor film in its channel formation region and has stable electric characteristics can be provided.

A highly reliable semiconductor device including the transistor can be provided.

BRIEF DESCRIPTION OF THE DRAWINGS

In the accompanying drawings.

DETAILED DESCRIPTION OF THE INVENTION

Figure 1:
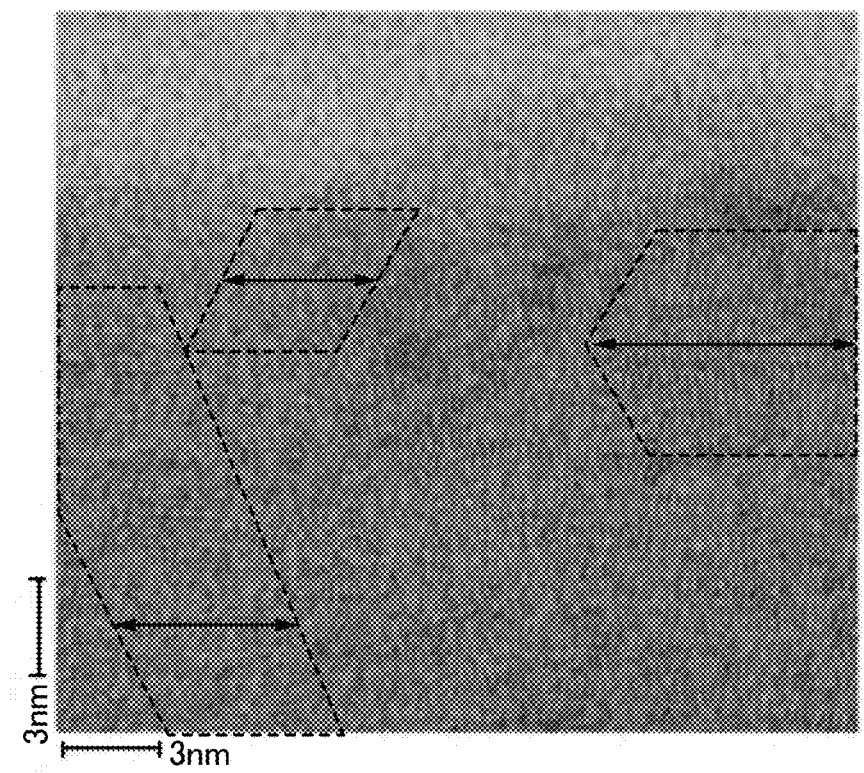
FIG. 1 is a TEM image of Example Sample.

Hereinafter, embodiments and an example of the invention disclosed in this specification will be described in detail with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments and example. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

An oxide semiconductor film of the invention disclosed in this specification is an oxide semiconductor (CAAC-OS) film which includes a crystal part whose c-axis is substantially perpendicular to a surface of the oxide semiconductor film and in which the length of a crystal arrangement part containing indium and oxygen on a plane perpendicular to the c-axis in the crystal part is more than 1.5 nm (preferably more than or equal to 2 nm and less than or equal to 20 nm).

An oxide semiconductor film of the invention disclosed in this specification is a CAAC-OS film including a crystal part in which a crystal arrangement part containing indium and oxygen on a plane perpendicular to the c-axis and having a length more than at least 1.5 nm (preferably more than or equal to 2 nm and less than or equal to 20 nm) is observed.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film, for example, includes an oxide semiconductor with crystal parts. Note that in most cases, a crystal part in the CAAC-OS film fits inside a cube whose one side is less than 100 nm. In an image obtained with a transmission electron microscope (TEM), a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among the crystal parts, the directions of the a-axis and the b-axis of one crystal part are different from those of another crystal part. In other words, because the a-axis and the b-axis vary among the crystal parts in the CAAC-OS film although the c-axes are aligned, the CAAC-OS film is not an epitaxially grown film. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where oxide semiconductor film is formed in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Figure 3:
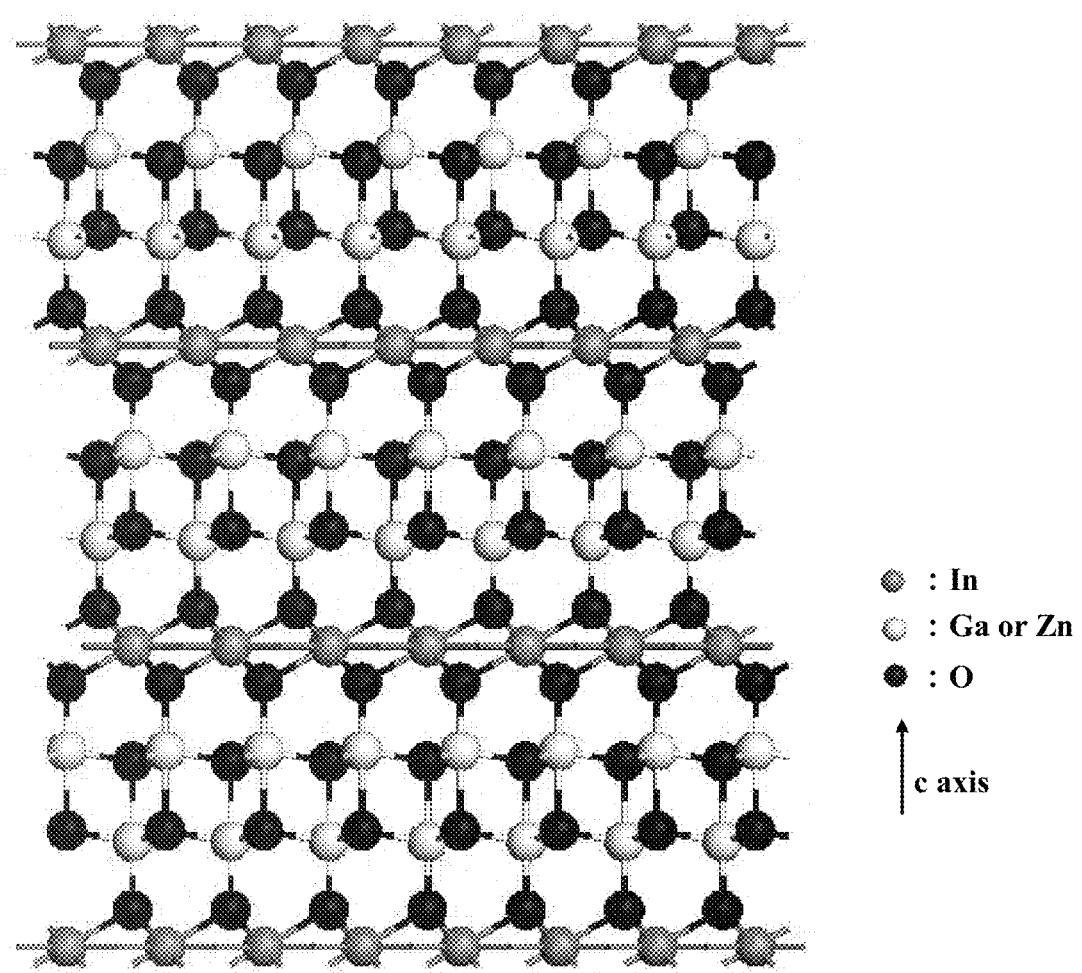
FIG. 3 illustrates one embodiment of a structure of a crystal part.

An example of a crystal structure of the crystal part in the CAAC-OS film is described with reference to FIG. 3. In FIG. 3, the upward direction corresponds to the c-axis direction and a plane perpendicular to the c-axis direction corresponds to the a-b plane, unless otherwise specified. In this embodiment, a structure of an In—Ga—Zn—O-based crystal which is included in a crystal part of an oxide semiconductor film containing indium, gallium, and zinc is exemplified. In FIG. 3, a gray sphere represents an indium atom, a white sphere represents a gallium atom or a zinc atom, a black sphere represents an oxygen atom, and an arrow represents the c-axis direction of the In—Ga—Zn—O-based crystal.

As illustrated in FIG. 3, in the structure of the c-axis aligned In—Ga—Zn—O-based crystal, indium and oxygen (In—O) has such crystal arrangement that indium atoms and oxygen atoms are arranged in a direction perpendicular to the c-axis. The oxide semiconductor film of the invention disclosed in this specification which contains indium, gallium, and zinc is a film including a crystal part in which the length of a crystal arrangement part containing indium and oxygen is more than at least 1.5 nm (preferably more than or equal to 2 nm and less than or equal to 20 nm).

An oxide semiconductor used for the oxide semiconductor film of the invention disclosed in this specification contains at least indium (In). In particular, the oxide semiconductor preferably contains In and zinc (Zn). As a stabilizer for reducing variation in electric characteristics of a transistor including the oxide semiconductor film, the oxide semiconductor preferably contains gallium (Ga), tin (Sn), hafnium (Hf), aluminum (Al), and/or zirconium (Zr) in addition to In and Zn.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as main components, and there is no limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, and n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor containing indium depending on needed semiconductor characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, the density, and the like be set to appropriate values.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$. For example, r may be 0.05. The same applies to other oxides.

Note that part of oxygen included in the oxide semiconductor film may be substituted with nitrogen.

An oxide semiconductor film of the invention disclosed in this specification can be formed by a sputtering method, a molecular beam epitaxy (MBE) method, a CVD method, a pulse laser deposition method, an atomic layer deposition (ALD) method, or the like. Alternatively, the oxide semiconductor film may be formed with a sputtering apparatus where deposition is performed with surfaces of a plurality of substrates set substantially perpendicular to a surface of a sputtering target. The oxide semiconductor film can be formed, for example, by any of the following methods: a method for forming a crystal part which is c-axis-aligned in a direction substantially perpendicular to a surface of the oxide semiconductor film by performing deposition while heat treatment is performed; a method for forming a crystal part which is c-axis-aligned in a direction substantially perpendicular to the surface of the oxide semiconductor film by crystallization treatment such as heat treatment after the deposition; and a method for forming an oxide semiconductor film including a crystal part which is c-axis-aligned in a direction substantially perpendicular to the surface of the oxide semiconductor film by depositing a film over a CAAC-OS film.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining its crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Further, the oxide semiconductor film including a crystal part of the invention disclosed in this specification can achieve higher mobility by improvement in flatness of the surface. In order to improve the surface flatness, the oxide semiconductor film is preferably formed on a flat surface. Specifically, the oxide semiconductor film is preferably formed on a surface with an average surface roughness (Ra) of less than or equal to 1 nm, preferably less than or equal to 0.3 nm, more preferably less than or equal to 0.1 nm.

Note that, $R_a$ is obtained by three-dimension expansion of arithmetic average roughness that is defined by JIS B 0601: 2001 (ISO4287:1997) so as to be applied to a curved plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \quad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

In the oxide semiconductor film (CAAC-OS film) disclosed in this specification, detachment of a metal element in the film is unlikely to occur even when heat treatment is performed, and low photoresponse is exhibited, as compared to an amorphous oxide semiconductor film. Accordingly, the oxide semiconductor film (CAAC-OS film) disclosed in this specification is highly stable to heat and light.

Further, the oxide semiconductor film (CAAC-OS film) disclosed in this specification has a low spin density. The number of oxygen defects in the oxide semiconductor film is smaller than that in an amorphous oxide semiconductor film.

Accordingly, a transistor including the oxide semiconductor film (CAAC-OS film) disclosed in this specification in its channel formation region has stable electric conductivity and is more electrically stable to heat and light.

Thus, a highly reliable semiconductor device which includes a transistor including the oxide semiconductor film in its channel formation region can be provided.

The structures, methods, and the like described in this embodiment can be combined as appropriate with any of the structures, methods, and the like described in the other embodiments.

Embodiment 2

A transistor included in a semiconductor device of the invention disclosed in this specification includes, in its channel formation region, the CAAC-OS film described in Embodiment 1 which includes a crystal part whose c-axis is substantially perpendicular to a surface of the CAAC-OS film and in which the length of a crystal arrangement part containing indium and oxygen on a plane perpendicular to the c-axis is more than 1.5 nm (preferably, more than or equal to 2 nm and less than or equal to 20 nm).

There is no particular limitation on the structure of the transistor included in the semiconductor device of the invention disclosed in this specification; for example, a staggered type or a planar type having a top-gate structure or a bottom-gate structure can be employed. Further, the transistor may have a single gate structure including one channel formation region, or a multi gate structure such as a double gate structure including two channel formation regions or a triple gate structure including three channel formation regions. Alternatively, the transistor may have a dual-gate structure including two gate electrode layers positioned above and below a channel formation region with a gate insulating film provided therebetween.

Examples of transistors each included in the semiconductor device of the invention disclosed in this specification are illustrated in FIGS. 5A to 5E. The transistors illustrated in FIGS. 5A to 5E each use, as an oxide semiconductor film 403, the CAAC-OS film described in Embodiment 1 which includes a crystal part whose c-axis is substantially perpendicular to the surface of the CAAC-OS film and in which the length of a crystal arrangement part containing indium and oxygen on a plane perpendicular to the c-axis is more than 1.5 nm (preferably, more than or equal to 2 nm and less than or equal to 20 nm).

Figure 5A:
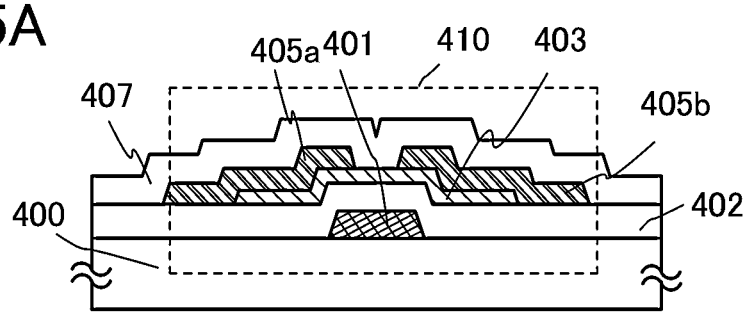
FIGS. 5A to 5E are each a cross-sectional view of an embodiment of a semiconductor device.

A transistor 410 illustrated in FIG. 5A is a kind of bottom-gate transistor and is also called an inverted staggered transistor.

The transistor 410 includes, over a substrate 400 having an insulating surface, a gate electrode layer 401, a gate insulating film 402, the oxide semiconductor film 403, a source electrode layer 405a, and a drain electrode layer 405b. In addition, an insulating film 407 which covers the transistor 410 and is stacked over the oxide semiconductor film 403 is provided.

Figure 5B:
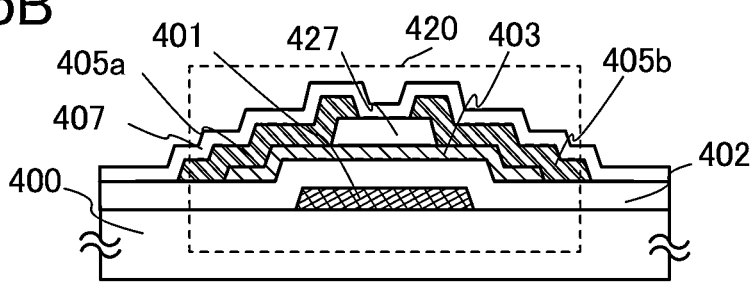

A transistor 420 illustrated in FIG. 5B is a kind of bottom-gate transistor referred to as a channel-protective transistor (also referred to as a channel-stop transistor) and is also referred to as an inverted-staggered transistor.

The transistor 420 includes, over the substrate 400 having an insulating surface, the gate electrode layer 401, the gate insulating film 402, the oxide semiconductor film 403, an insulating film 427 functioning as a channel protective layer covering a channel formation region of the oxide semiconductor film 403, the source electrode layer 405a, and the drain electrode layer 405b. The insulating film 407 is provided to cover the transistor 420.

Figure 5C:
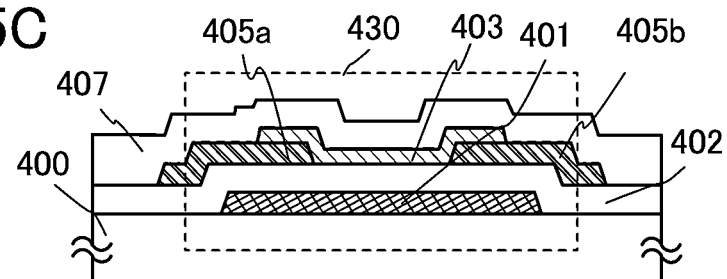

A transistor 430 shown in FIG. 5C is a bottom-gate transistor and includes, over the substrate 400 having an insulating surface, the gate electrode layer 401, the gate insulating film 402, the source electrode layer 405a, the drain electrode layer 405b, and the oxide semiconductor film 403. The insulating film 407 which covers the transistor 430 and is in contact with the oxide semiconductor film 403 is provided.

In the transistor 430, the gate insulating film 402 is provided over and in contact with the substrate 400 and the gate electrode layer 401, and the source electrode layer 405a and the drain electrode layer 405b are provided over and in contact with the gate insulating film 402. Further, the oxide semiconductor film 403 is provided over the gate insulating film 402, the source electrode layer 405a, and the drain electrode layer 405b.

Figure 5D:
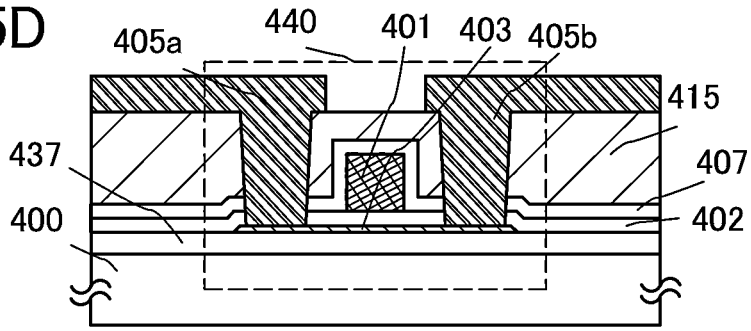

A transistor 440 illustrated in FIG. 5D is one kind of top-gate transistor. The transistor 440 includes, over the substrate 400 having an insulating surface, an insulating film 437, the oxide semiconductor film 403, the source electrode layer 405a, the drain electrode layer 405b, the gate insulating film 402, and the gate electrode layer 401. The source electrode layer 405a and the drain electrode layer 405b are electrically connected to the oxide semiconductor film 403 in an opening formed in the gate insulating film 402, the insulating film 407, and the insulating film 415.

Figure 5E:
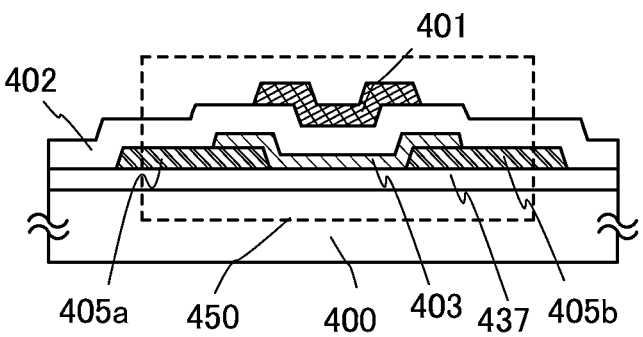

A transistor 450 illustrated in FIG. 5E is one kind of top-gate transistor. The transistor 450 includes, over the substrate 400 having an insulating surface, the insulating film 437, the source electrode layer 405a, the drain electrode layer 405b, the oxide semiconductor film 403, the gate insulating film 402, and the gate electrode layer 401.

There is no particular limitation on a substrate that can be used as the substrate 400 having an insulating surface as long as it has heat resistance enough to withstand heat treatment performed later. A variety of glass substrates for electronics industry, such as a barium borosilicate glass substrate and an aluminoborosilicate glass substrate, can be used as the substrate 400. Note that as the substrate, a substrate having a thermal expansion coefficient of greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$ C.) and a strain point of higher than or equal to 650° C. and lower than or equal to 750° C. (preferably higher than or equal to 700° C. and lower than or equal to 740° C.) is preferably used.

In the case where a large-sized glass substrate with any of the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), and the 10th generation (2880 mm×3130 mm) is used, minute processing might become difficult owing to shrinkage of the substrate caused by heat treatment or the like in the process for manufacturing a semiconductor device. Therefore, when such a large-sized glass substrate is used as the substrate, the one with a small shrinkage is preferably used. For example, as the substrate, a large-sized glass substrate whose shrinkage by heat treatment for one hour at preferably 450° C., more preferably 500° C. is less than or equal to 20 ppm, preferably less than or equal to 10 ppm, more preferably less than or equal to 5 ppm may be used.

Alternatively, a ceramic substrate, a quartz substrate, a sapphire substrate, or the like can be used as the substrate 400. Alternatively, a single crystal semiconductor substrate or a polycrystalline semiconductor substrate made of silicon or silicon carbide, a compound semiconductor substrate made of silicon germanium or the like, an SOI substrate, or the like can be used. Alternatively, any of these substrates over which a semiconductor element is provided may be used.

The semiconductor device may be manufactured using a flexible substrate as the substrate 400. To manufacture a flexible semiconductor device, the transistor 440 including the oxide semiconductor film 403 may be directly formed over a flexible substrate; or alternatively, the transistor 440 including the oxide semiconductor film 403 may be formed over a manufacturing substrate, and then the transistor may be separated from the manufacturing substrate and transferred to a flexible substrate. Note that, in order to separate the transistor from the manufacturing substrate and transfer it to the flexible substrate, a separation layer may be provided between the manufacturing substrate and the transistor 440 including the oxide semiconductor film.

The insulating film 437 can be formed by a plasma CVD method, a sputtering method, or the like using an oxide insulating film of silicon oxide, silicon oxynitride, aluminum oxide, aluminum oxynitride, hafnium oxide, gallium oxide, or the like; a nitride insulating film of silicon nitride, silicon nitride oxide, aluminum nitride, aluminum nitride oxide, or the like; or a mixed material thereof.

The gate electrode layer 401 can be formed with the use of a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. The gate electrode layer 401 can have a stacked structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used.

The gate insulating film 402 can be formed by a sputtering method or a CVD method using a deposition gas. As the CVD method, an LPCVD method, a plasma CVD method, or the like can be used, and as another method, a coating film or the like can also be used.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

When the gate insulating film 402 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. Further, the gate insulating film 402 has either a single-layer structure or a stacked-layer structure.

As the source electrode layer 405a and the drain electrode layer 405b, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used as the source electrode layer 405a and the drain electrode layer 405b may be formed using conductive metal oxide. As the conductive metal oxide, indium oxide ($In_2O_3$), tin oxide ($SnO_2$), zinc oxide ($ZnO$), indium oxide-tin oxide ($In_2O_3$—$SnO_2$), indium oxide-zinc oxide ($In_2O_3$—$ZnO$), or any of these metal oxide materials in which silicon oxide is contained can be used.

The insulating films 407, 415, and 427 can be formed by a plasma CVD method, a sputtering method, an evaporation method, or the like.

Each of the insulating films 407, 415, and 427 can be a single layer or a stacked layer of a silicon oxide film, a silicon oxynitride film, an aluminum oxide film, an aluminum oxynitride film, an inorganic insulating film such as a gallium oxide film, a hafnium oxide film, a magnesium oxide film, a zirconium oxide film, a lanthanum oxide film, a barium oxide film, a silicon nitride film, a silicon nitride oxide film, an aluminum nitride film, or an aluminum nitride oxide film, or the like.

In addition, a planarization insulating film may be formed over the transistor in order that surface unevenness due to the transistor is reduced. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed from these materials.

In the oxide semiconductor film (the CAAC-OS film) 403 disclosed in this specification, detachment of a metal element in the film is unlikely to occur even when heat treatment is performed, and low photoresponse is exhibited, as compared to an amorphous oxide semiconductor film. Accordingly, the oxide semiconductor film (CAAC-OS film) disclosed in this specification is highly stable to heat and light.

Further, the oxide semiconductor film (CAAC-OS film) 403 disclosed in this specification has a low spin density. The number of oxygen defects in the oxide semiconductor film is smaller than that in an amorphous oxide semiconductor film.

Therefore, the transistors 410, 420, 430, 440, and 450 each including, in its channel formation region, the oxide semiconductor film (the CAAC-OS film) disclosed in this specification have stable electric conductivity and are more electrically stable to heat and light.

Accordingly, a highly reliable semiconductor device which includes a transistor including the oxide semiconductor film in its channel formation region can be provided.

The structures, methods, and the like described in this embodiment can be combined as appropriate with any of the structures, methods, and the like described in the other embodiments.

Embodiment 3

The transistor of one embodiment of the invention disclosed in this specification can be applied to semiconductor devices having a variety of functions. For example, the transistor can be applied to a memory device, a central processing unit (CPU), or an LSI such as a digital signal processor (DSP), a custom LSI, or a field programmable gate array (FPGA).

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as digital still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances are illustrated in FIGS. 6A to 6C.

Figure 6A:
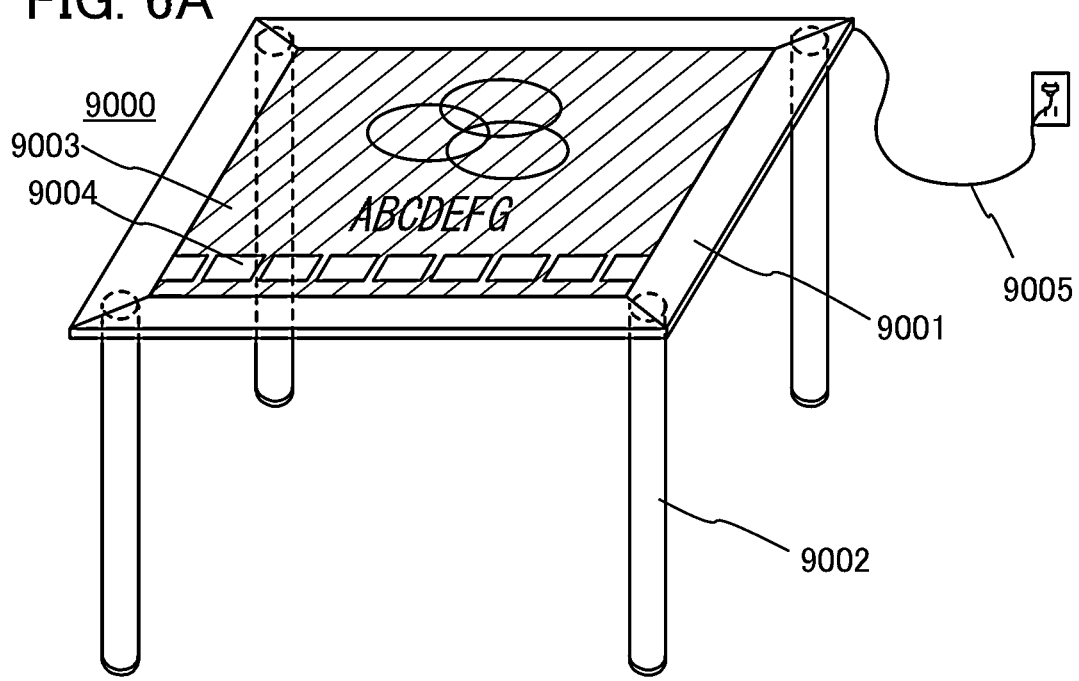
FIGS. 6A to 6C are views each illustrating an electronic appliance.
Figure 6B:
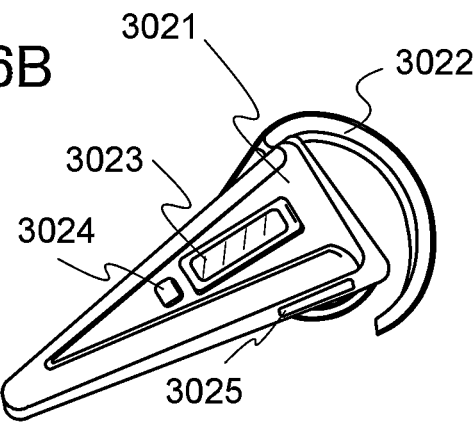
Figure 6C:
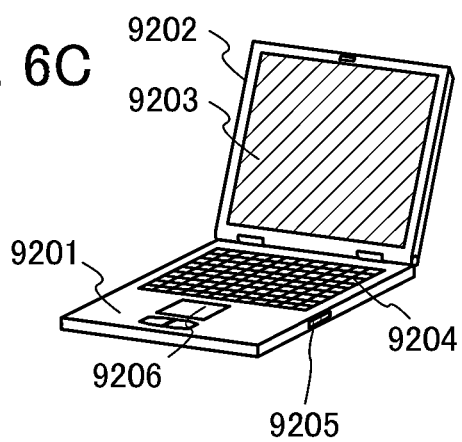

FIG. 6A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor of one embodiment of the invention disclosed in this specification can be used for the display portion 9003, so that the electronic appliance can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 6B illustrates a portable music player, which includes, in a main body 3021, a display portion 3023, a fixing portion 3022 with which the main body is worn on the ear, a speaker, an operation button 3024, an external memory slot 3025, and the like. By application of the transistor of one embodiment of the invention disclosed in this specification or a memory including the transistor to a memory, a CPU, or the like which is incorporated in the main body 3021, a portable music player (PDA) whose power consumption is further reduced can be achieved.

Furthermore, when the portable music player illustrated in FIG. 6B has an antenna, a microphone function, or a wireless communication function and is used with a mobile phone, a user can talk on the phone wirelessly in a hands-free way while driving a car or the like.

FIG. 6C illustrates a computer, which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When a CPU including the transistor of one embodiment of the invention disclosed in this specification is used, power consumption of the computer can be reduced.

Figure 7A:
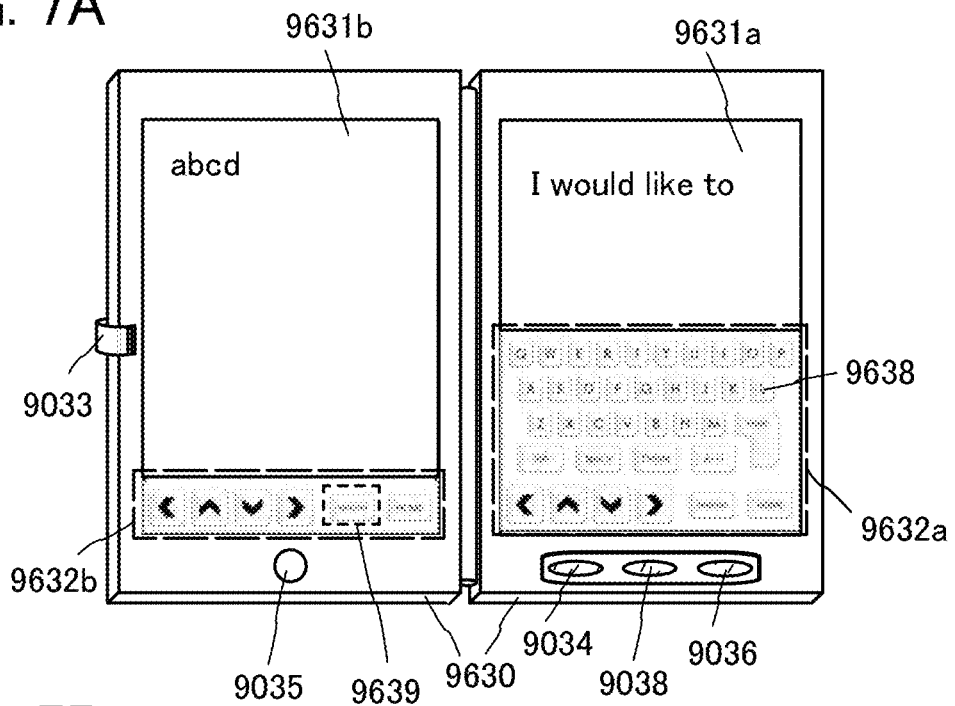
FIGS. 7A to 7C are views illustrating an electronic appliance.
Figure 7B:
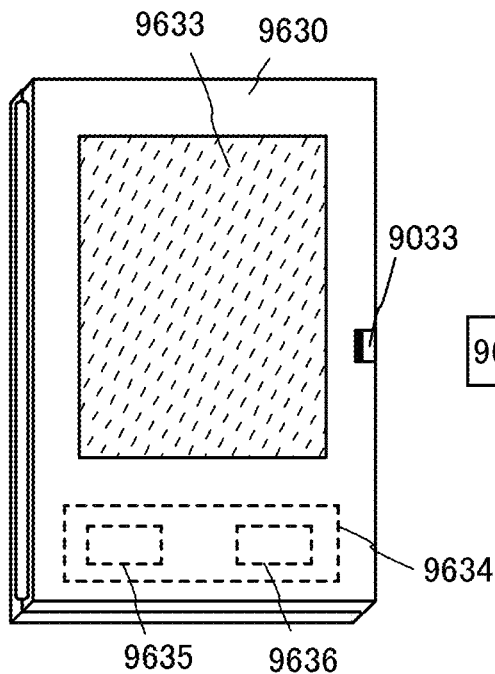

FIGS. 7A and 7B illustrate a tablet terminal that can be folded. In FIG. 7A, the tablet terminal is opened, and includes a housing 9630, a display portion 9631a, a display portion 9631b, a display-mode switching button 9034, a power button 9035, a power-saving-mode switching button 9036, a clip 9033, and an operation button 9638.

In such a portable device illustrated in FIGS. 7A and 7B, an SRAM or a DRAM is used as a memory for temporarily storing image data. For example, a semiconductor device including the transistor of one embodiment of the invention disclosed in this specification can be used as a memory. The semiconductor device employed for the memory enables high-speed writing and reading of data, long-time retention of data, and sufficient reduction of power consumption.

A touch panel area 9632a can be provided in a part of the display portion 9631a, in which data can be input by touching displayed operation keys 9638. Although half of the display portion 9631a has only a display function and the other half has a touch panel function, one embodiment of the present invention is not limited to the structure. The whole display portion 9631a may have a touch panel function. For example, the display portion 9631a can display a keyboard in the whole region to be used as a touch panel, and the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display area in FIG. 7A, an embodiment of the present invention is not limited to this example. The display portion 9631a and the display portion 9631b may have different areas or different display quality. For example, one of them may be a display panel that can display higher-definition images than the other.

FIG. 7B illustrates the tablet terminal folded, which includes the housing 9630, a solar battery 9633, a charge and discharge control circuit 9634, a battery 9635, and a DCDC converter 9636. Note that FIG. 7B shows an example in which the charge and discharge control circuit 9634 includes the battery 9635 and the DCDC converter 9636.

Since the tablet terminal can be folded in two, the housing 9630 can be closed when the tablet terminal is not in use. Thus, the display portions 9631a and 9631b can be protected, thereby providing a tablet terminal with high endurance and high reliability for long-term use.

The tablet terminal illustrated in FIGS. 7A and 7B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently, which is preferable. When a lithium ion battery is used as the battery 9635, there is an advantage of downsizing or the like.

Figure 7C:
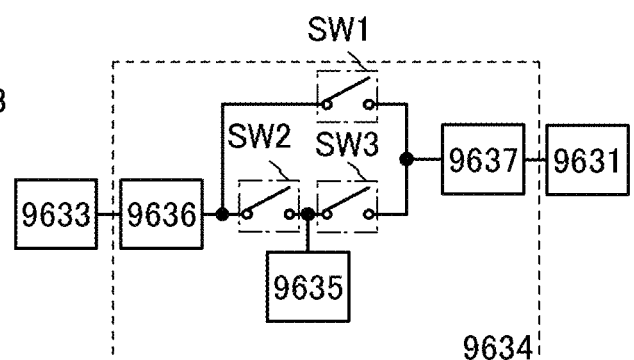

The structure and operation of the charge and discharge control circuit 9634 illustrated in FIG. 7B are described with reference to a block diagram of FIG. 7C. FIG. 7C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 7B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power by wireless (without contact), or another charging means may be used in combination.

Figure 8A:
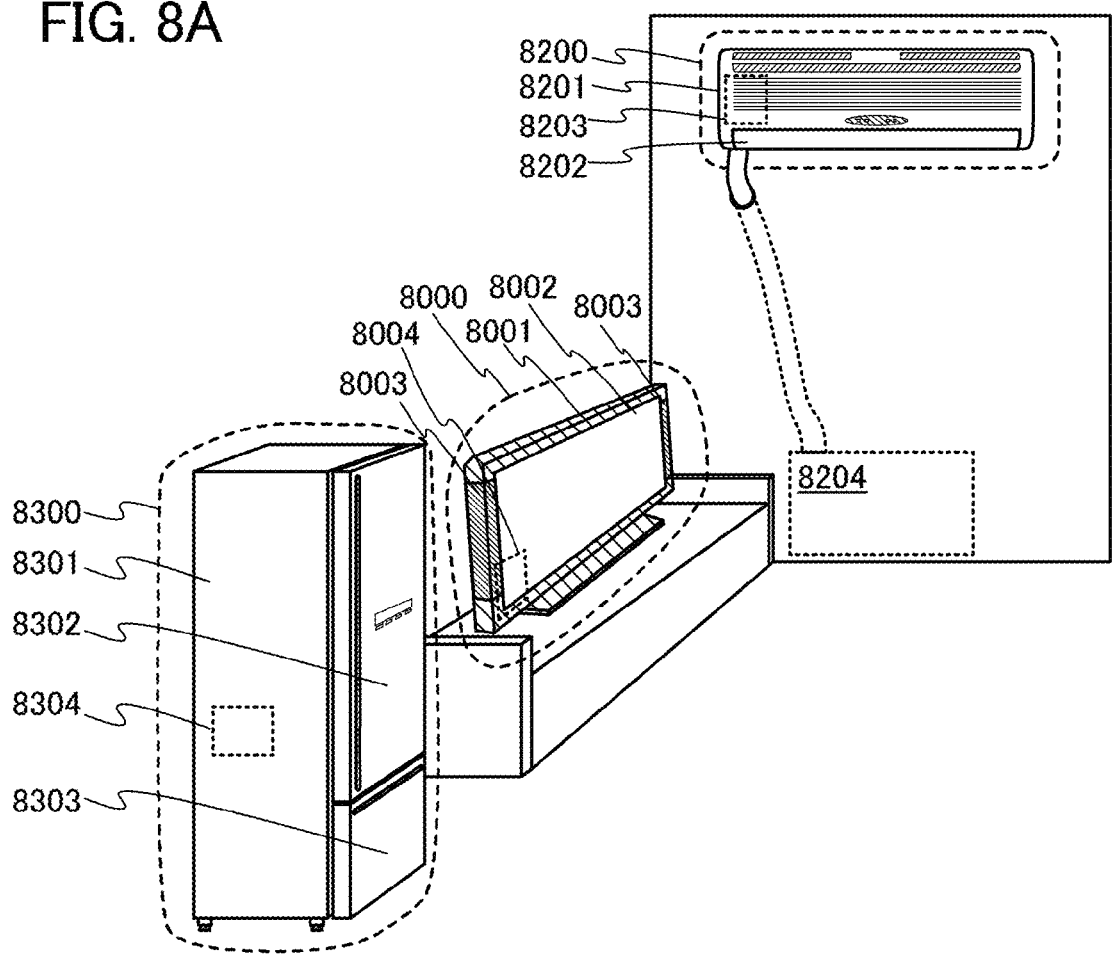
FIGS. 8A to 8C are views illustrating electronic appliances.

In a television set 8000 in FIG. 8A, a display portion 8002 is incorporated in a housing 8001. The display portion 8002 displays an image and a speaker portion 8003 can output sound. The transistor of one embodiment of the invention disclosed in this specification can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. The television set 8000 can receive a general television broadcast with the receiver. Furthermore, the television device 8000 can be connected to a communication network by wired or wireless connection via the modem, which enables one-way (from a transmitter to a receiver) or two-way (between a transmitter and a receiver, between receivers, or the like) data communication.

In addition, the television set 8000 may include a CPU for performing information communication or a memory. A memory or a CPU which includes the transistor of one embodiment of the invention disclosed in this specification can be used for the television set 8000.

In FIG. 8A, an air conditioner including an indoor unit 8200 and an outdoor unit 8204 is an example of an electronic appliance to which a CPU including the transistor of one embodiment of the invention disclosed in this specification is applied. Specifically, the indoor unit 8200 includes a housing 8201, an air outlet 8202, a CPU 8203, and the like. FIG. 8A illustrates the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU including the transistor of one embodiment of the invention disclosed in this specification is a CPU using an oxide semiconductor, an air conditioner with high heat resistance and high reliability can be achieved.

In FIG. 8A, an electric refrigerator-freezer 8300 is an example of an electronic appliance which is provided with the CPU formed using an oxide semiconductor. Specifically, the electric refrigerator-freezer 8300 includes a housing 8301, a door for a refrigerator 8302, a door for a freezer 8303, a CPU 8304, and the like. In FIG. 8A, the CPU 8304 is provided in the housing 8301. By using the CPU including the transistor of one embodiment of the invention disclosed in this specification as the CPU 8304 of the electric refrigerator-freezer 8300, power consumption can be reduced.

Figure 8B:
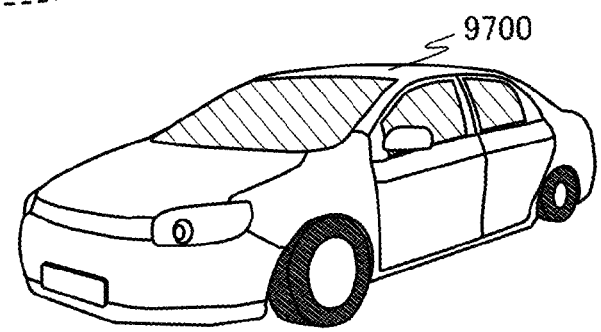
Figure 8C:
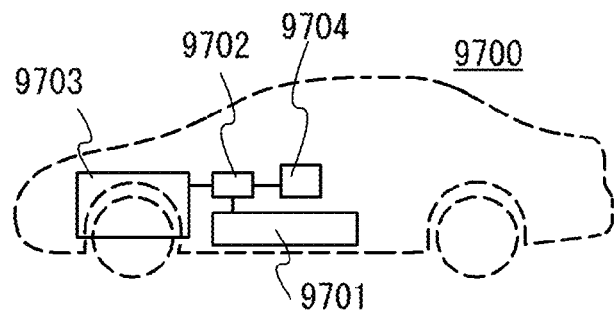

FIG. 8B illustrates an example of an electric vehicle which is an example of an electronic appliance. An electric vehicle 9700 is equipped with a secondary battery 9701. The output of the electric power of the secondary battery 9701 is adjusted by a control circuit 9702 so that the electric power is supplied to a driving device 9703. The control circuit 9702 is controlled by a processing unit 9704 including a ROM, a RAM, a CPU, or the like which is not illustrated. By using the CPU including the transistor of one embodiment of the invention disclosed in this specification as a CPU of the electric vehicle 9700, power consumption can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The structures, methods, and the like described in this embodiment can be combined as appropriate with any of the structures, methods, and the like described in the other embodiments.

Example

In this example, the crystalline state of an oxide semiconductor film was observed. As samples, Example Sample and Comparative Sample were formed.

An In—Ga—Zn—O film with a thickness of 200 nm was formed as an oxide semiconductor film over a glass substrate by a sputtering method using an oxide target with the following atomic ratio, In:Ga:Zn=1:1:1.

The film formation conditions of Example Sample were as follows: the atmosphere was an oxygen atmosphere (oxygen=100 sccm), the pressure was 0.6 Pa, the power of the power source was 2 kW, and the substrate temperature was 170° C.

The film formation conditions of Comparative Sample were as follows: the atmosphere was an atmosphere of argon and oxygen (argon:oxygen=10 sccm:90 sccm), the pressure was 0.6 Pa, the power of the power source was 5 kW, and the substrate temperature was 170° C.

End planes were cut out from Example Sample and Comparative Sample obtained through the above-described process, and cross-sections of the In—Ga—Zn—O films were observed with a high-resolution transmission electron microscope (TEM: "H9000-NAR" manufactured by Hitachi High-Technologies Corporation) at an acceleration voltage of 300 kV. FIG. 1 is a TEM image of Example Sample at a magnification of 8 million, and FIG. 2 is a TEM image of Comparative Sample at a magnification of 8 million.

Figure 4A:
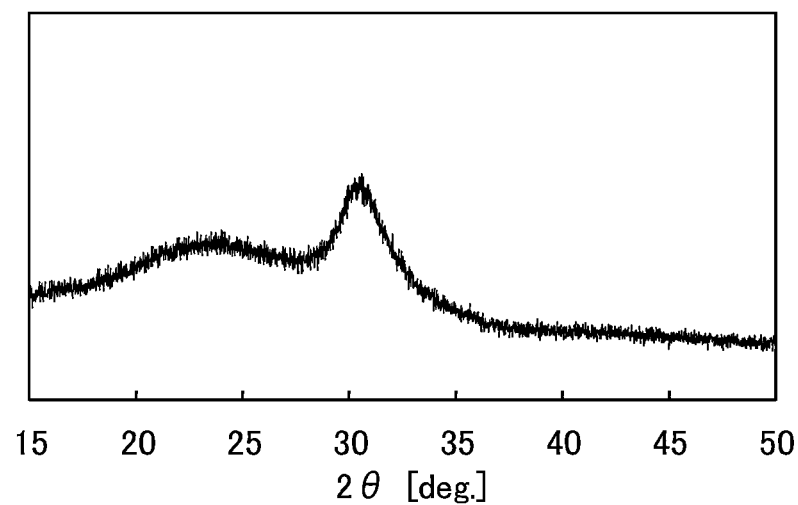
FIG. 4A is a graph showing XRD results of Example Sample.
Figure 4B:
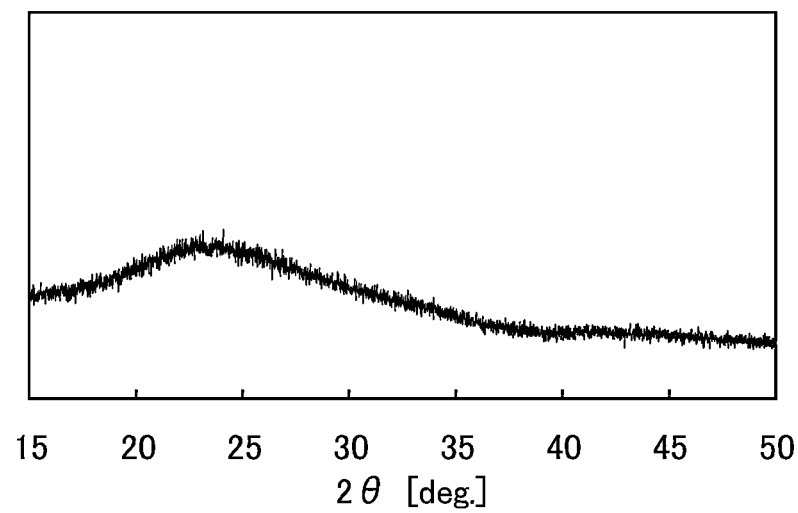
FIG. 4B is a graph showing XRD results of Comparative Sample.

Further, X-ray diffraction (XRD) of the In—Ga—Zn—O film of each of Example Sample and Comparative Sample was measured. FIGS. 4A and 4B show XRD spectra of Example Sample and Comparative Sample, respectively, which were measured by an out-of-plane method, and FIG. 4B shows an XRD spectrum of Comparative Sample, which was measured by an out-of-plane method. In FIGS. 4A and 4B, the vertical axis indicates the X-ray diffraction intensity (arbitrary unit) and the horizontal axis indicates the rotation angle 2θ(degree). Note that the XRD spectra were measured with the use of an X-ray diffractometer D8 ADVANCE manufactured by Bruker AXS.

As shown in the TEM image of FIG. 1, in the In—Ga—Zn—O film of Example Sample, a crystal part in a layer form, whose c-axis is substantially perpendicular to a surface of the film and whose length in a direction perpendicular to the c-axis is more than 1.5 nm was observed. Note that in FIG. 1, the crystal part is a region surrounded by a dotted line, and the length of a crystal arrangement part containing indium and oxygen in the In—Ga—Zn—O film of Example Sample is the length of an arrow in FIG. 1. In the XRD spectrum of Example Sample as shown in FIG. 4A, a peak attributed to a diffraction on the (009) plane of an $InGaZnO_4$ crystal was observed at around 31° (=2θ).

Figure 2:
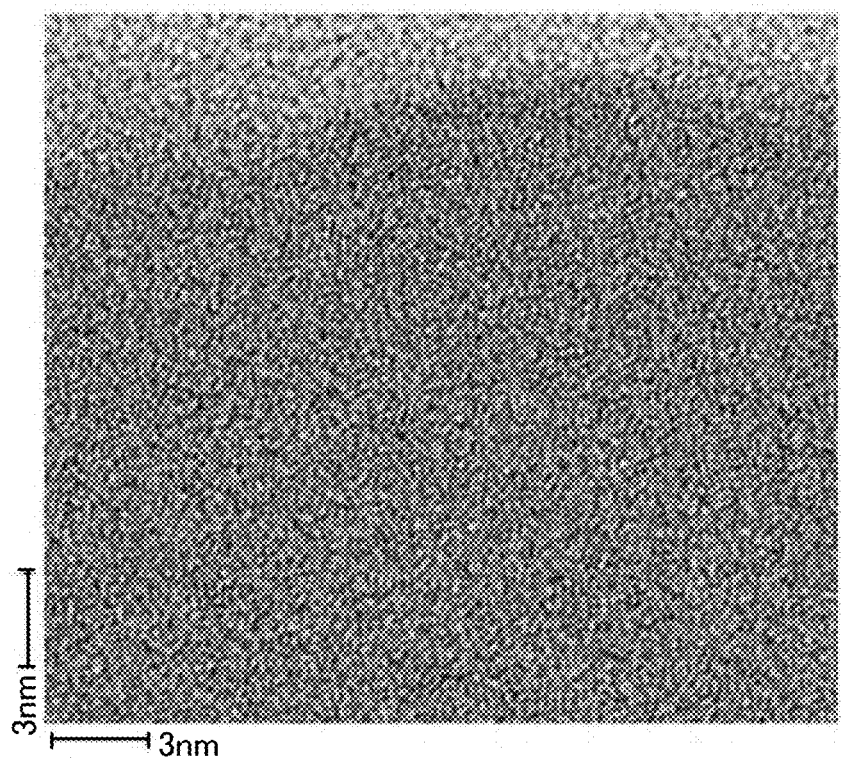
FIG. 2 is a TEM image of Comparative Sample.

While, as shown in the TEM image of FIG. 2, in the In—Ga—Zn—O film which is Comparative Sample, a crystal having a c-axis substantially perpendicular to a surface of the film was not observed. Further, as shown in FIG. 4B, a peak indicating the crystal having a c-axis substantially perpendicular to the surface is not observed in the XRD spectrum.

The oxide semiconductor film of Example Sample includes a crystal part whose c-axis is substantially perpendicular to the surface, and the length of a crystal arrangement part containing indium and oxygen on a plane perpendicular to the c-axis in the crystal part is more than 1.5 nm. By using such an oxide semiconductor film, a transistor having stable electric characteristics and a highly reliable semiconductor device can be provided.

This application is based on Japanese Patent Application serial no. 2012-056643 filed with Japan Patent Office on Mar. 14, 2012, the entire contents of which are hereby incorporated by reference.

What is claimed is:

1. An oxide semiconductor film comprising:
a first crystal part and a second crystal part,
wherein c-axes of the first crystal part and the second crystal part are aligned;
wherein each of the c-axes is substantially perpendicular to a surface of the oxide semiconductor film; and
wherein in each of the first crystal part and the second crystal part, a length of a crystal arrangement part on a plane perpendicular to the c-axis is more than 1.5 nm and less than or equal to 20 nm,
wherein the oxide semiconductor film is in a non-single-crystal state, and
wherein the first crystal part and the second crystal part are spaced apart from each other.

2. The oxide semiconductor film according to claim 1, wherein the each of the first crystal part and the second crystal part includes indium atoms, oxygen atoms, gallium atoms, and zinc atoms.

3. A transistor comprising the oxide semiconductor film according to claim 1 in a channel formation region of the transistor.

4. The oxide semiconductor film according to claim 1, wherein directions of an a-axis and a b-axis of the first crystal part are different from those of the second crystal part.

5. An oxide semiconductor film comprising:
a first crystal part and a second crystal part,
wherein c-axes of the first crystal part and the second crystal part are aligned;
wherein each of the c-axes is substantially perpendicular to a surface of the oxide semiconductor film; and
wherein in each of the first crystal part and the second crystal part, a length of a crystal arrangement part containing indium atoms and oxygen atoms on a plane perpendicular to the c-axis is more than or equal to 1.5 nm and less than or equal to 20 nm,
wherein the oxide semiconductor film is in a non-single-crystal state, and
wherein the first crystal part and the second crystal part are spaced apart from each other.

6. The oxide semiconductor film according to claim 5, wherein directions of an a-axis and a b-axis of the first crystal part are different from those of the second crystal part.

7. The oxide semiconductor film according to claim 5, wherein the each of the first crystal part and the second crystal part further includes gallium atoms and zinc atoms.

8. A transistor comprising the oxide semiconductor film according to claim 5 in a channel formation region of the transistor.

* * * * *